(12) United States Patent
Diglio et al.

(10) Patent No.: US 11,543,454 B2
(45) Date of Patent: Jan. 3, 2023

(54) DOUBLE-BEAM TEST PROBE

(71) Applicant: Intel Corporation, Santa Clara, CA (US)

(72) Inventors: Paul J. Diglio, Gaston, OR (US); Pooya Tadayon, Portland, OR (US); Karumbu Meyyappan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 819 days.

(21) Appl. No.: 16/141,422

(22) Filed: Sep. 25, 2018

(65) Prior Publication Data

US 2020/0096567 A1  Mar. 26, 2020

(51) Int. Cl.
  *G01R 31/319* (2006.01)
  *G01R 1/073* (2006.01)

(52) U.S. Cl.
  CPC ... *G01R 31/31905* (2013.01); *G01R 1/07357* (2013.01)

(58) Field of Classification Search
  CPC .......... G01R 1/07357; G01R 31/31905; G01R 1/07342; G01R 1/06727; G01R 1/06716; G01R 1/07371
  See application file for complete search history.

(56) References Cited

U.S. PATENT DOCUMENTS

| | | | |
|---|---|---|---|
| 3,622,387 A | 11/1971 | Grandadam | |
| 4,581,260 A | 4/1986 | Mawla | |
| 5,307,560 A | 5/1994 | Aksu | |
| 5,453,701 A | 9/1995 | Jensen et al. | |
| 5,592,222 A | 1/1997 | Nakamura et al. | |
| 5,635,848 A | 6/1997 | Hammond et al. | |
| 5,747,999 A | 5/1998 | Yamaoka | |
| 5,767,692 A | 6/1998 | Antonello et al. | |
| 5,917,329 A | 6/1999 | Cadwallader et al. | |
| 6,130,545 A | 10/2000 | Kiser et al. | |
| 6,292,004 B1 | 9/2001 | Kocher | |
| 6,356,090 B2 | 3/2002 | Deshayes | |
| 6,441,315 B1 | 8/2002 | Eldridge et al. | |
| 6,740,163 B1 | 5/2004 | Curtiss et al. | |

(Continued)

FOREIGN PATENT DOCUMENTS

| | | |
|---|---|---|
| EP | 0962776 | 12/1999 |
| JP | 11-344510 | 12/1999 |

OTHER PUBLICATIONS

Darling, K.A., et al., "Mitigating grain growth in binary nanocrystalline alloys through solute selection based on thermodynamic stability maps", Computational Material Science; 84 (2014), 255-266.

(Continued)

*Primary Examiner* — Lee E Rodak
*Assistant Examiner* — Brent J Andrews
(74) *Attorney, Agent, or Firm* — Essential Patents Group, LLP.

(57) ABSTRACT

Embodiments herein relate to a test probe. The test probe may have a first plurality of beams and a second plurality of beams. An intermediate substrate may be positioned between the first plurality of beams and the second plurality of beams. In embodiments, both the first and second plurality of beams may be angled. Other embodiments may be described or claimed.

24 Claims, 4 Drawing Sheets

(56) References Cited

U.S. PATENT DOCUMENTS

| | | | |
|---|---|---|---|
| 6,774,654 B2* | 8/2004 | Kanamaru | G01R 1/07357 324/754.11 |
| 6,812,718 B1 | 11/2004 | Chong et al. | |
| 7,189,077 B1 | 3/2007 | Eldridge et al. | |
| 7,436,193 B2 | 10/2008 | Crippen | |
| 7,566,228 B2 | 7/2009 | Chiu | |
| 7,884,632 B2 | 2/2011 | Shiraishi et al. | |
| 7,928,522 B2 | 4/2011 | Zhu et al. | |
| 8,029,291 B2 | 10/2011 | Park | |
| 8,267,831 B1 | 9/2012 | Olsen et al. | |
| 8,411,550 B2 | 4/2013 | Chou et al. | |
| 9,227,324 B1 | 1/2016 | Abdul Rashid et al. | |
| 2002/0024347 A1 | 2/2002 | Felici et al. | |
| 2002/0163349 A1 | 11/2002 | Wada et al. | |
| 2005/0051515 A1 | 3/2005 | Nam | |
| 2005/0151547 A1 | 7/2005 | Machida et al. | |
| 2005/0231855 A1 | 10/2005 | Tran | |
| 2005/0263401 A1 | 12/2005 | Olsen et al. | |
| 2006/0151614 A1 | 7/2006 | Nishizawa et al. | |
| 2006/0152232 A1 | 7/2006 | Shvets et al. | |
| 2006/0171425 A1 | 8/2006 | Lee et al. | |
| 2006/0214674 A1 | 9/2006 | Lee et al. | |
| 2007/0126435 A1 | 6/2007 | Eldridge et al. | |
| 2007/0126440 A1 | 6/2007 | Hobbs et al. | |
| 2007/0290371 A1 | 12/2007 | Chen | |
| 2008/0074132 A1* | 3/2008 | Fan | G01R 1/07342 324/754.03 |
| 2008/0088327 A1 | 4/2008 | Kister | |
| 2008/0196474 A1 | 8/2008 | Di Stefano et al. | |
| 2008/0204061 A1 | 8/2008 | Chartarifsky et al. | |
| 2008/0231300 A1 | 9/2008 | Yamada et al. | |
| 2008/0309363 A1 | 12/2008 | Jeon et al. | |
| 2009/0056428 A1 | 3/2009 | King | |
| 2009/0072851 A1 | 3/2009 | Namburi et al. | |
| 2009/0219047 A1 | 9/2009 | Peterson et al. | |
| 2009/0237099 A1 | 9/2009 | Garabedian et al. | |
| 2010/0052715 A1 | 3/2010 | Beaman et al. | |
| 2010/0066393 A1 | 3/2010 | Bottoms et al. | |
| 2010/0079159 A1 | 4/2010 | Kemmerling | |
| 2010/0276572 A1 | 11/2010 | Iwabuchi et al. | |
| 2011/0031991 A1 | 2/2011 | Lee et al. | |
| 2011/0115513 A1 | 5/2011 | Harada | |
| 2011/0163773 A1 | 7/2011 | Zelder et al. | |
| 2011/0234251 A1 | 9/2011 | Komatsu et al. | |
| 2012/0038383 A1 | 2/2012 | Wu et al. | |
| 2012/0071037 A1 | 3/2012 | Balucani | |
| 2012/0100287 A1 | 4/2012 | Wong | |
| 2012/0117799 A1 | 5/2012 | Luo | |
| 2012/0146679 A1* | 6/2012 | Chang | G01R 1/07378 324/756.03 |
| 2012/0319710 A1 | 12/2012 | Dabrowiecki et al. | |
| 2013/0002285 A1 | 1/2013 | Nelson et al. | |
| 2013/0099812 A1 | 4/2013 | Wang et al. | |
| 2013/0200910 A1 | 8/2013 | Ellis-Monaghan et al. | |
| 2013/0285688 A1 | 10/2013 | Namburi et al. | |
| 2014/0021976 A1 | 1/2014 | Tanaka | |
| 2014/0125372 A1 | 5/2014 | Fukasawa et al. | |
| 2014/0132297 A1 | 5/2014 | Hwang et al. | |
| 2014/0253162 A1 | 9/2014 | Wang | |
| 2014/0347085 A1 | 11/2014 | Kuo et al. | |
| 2014/0362425 A1 | 12/2014 | Stephens et al. | |
| 2014/0363905 A1 | 12/2014 | McShane et al. | |
| 2015/0015291 A1 | 1/2015 | Ku et al. | |
| 2015/0123693 A1 | 5/2015 | Ota et al. | |
| 2015/0192633 A1 | 7/2015 | Garibay et al. | |
| 2015/0226783 A1 | 8/2015 | Kang | |
| 2016/0079635 A1 | 3/2016 | Niwa | |
| 2016/0178663 A1 | 6/2016 | Prabhugoud et al. | |
| 2016/0223590 A1* | 8/2016 | Hsu | G01R 1/07357 |
| 2017/0219626 A1 | 8/2017 | Gardell et al. | |
| 2018/0003767 A1 | 1/2018 | Crippa et al. | |
| 2018/0143222 A1 | 5/2018 | Lee et al. | |
| 2019/0203370 A1 | 7/2019 | Walczyk et al. | |
| 2019/0212366 A1 | 7/2019 | Tadayon et al. | |
| 2020/0006868 A1 | 1/2020 | Tillotson, Jr. | |
| 2020/0025801 A1 | 1/2020 | Tadayon et al. | |
| 2021/0302489 A1 | 9/2021 | Tadayon | |

OTHER PUBLICATIONS

Luo, J.K., et al., "Young's modulus of electroplated Ni thin film for MEMS applications", Materials Letters, vol. 58, Issues 17-18, Jul. 2004, pp. 2306-2309.

Weeden, et al., "Probe Card Tutorial", www.tek.com/keithley, 2003, 40 pages, Keithley Instruments, Inc.

Wikipedia, "Probe Card", last edited on Jul. 29, 2016, 2 pages, Wikipeadia, https://en.wikipedia.org/wiki/probe_card.

* cited by examiner

DOUBLE-BEAM TEST PROBE

BACKGROUND

Test probes may be used to measure aspects of semiconductor packages. Particularly, test probes may include a plurality of beams that are configured to contact one or more portions of a device under test (DUT), and thereby allow a computing system coupled with the test probes to make one or more measurements about the DUT. However, in some deployment scenarios the test probes may become prohibitively expensive as they become smaller. Additionally, some legacy probes may have significant overtravel requirements, generally on the order of several millimeters (mms). However, the relatively long overtravel distance may increase the risk of positional accuracy error at the tip of the test probe when the pitch of the probe's scales below a certain threshold. Finally, some probes may suffer from high-scrub (i.e., horizontal to vertical translation) characteristics. More specifically, if the probe is not allowed to translate in the scrub direction, then the probe may undergo a buckling stress and ultimately yield or fall off the desired portion of the DUT.

DETAILED DESCRIPTION

Figure 1:
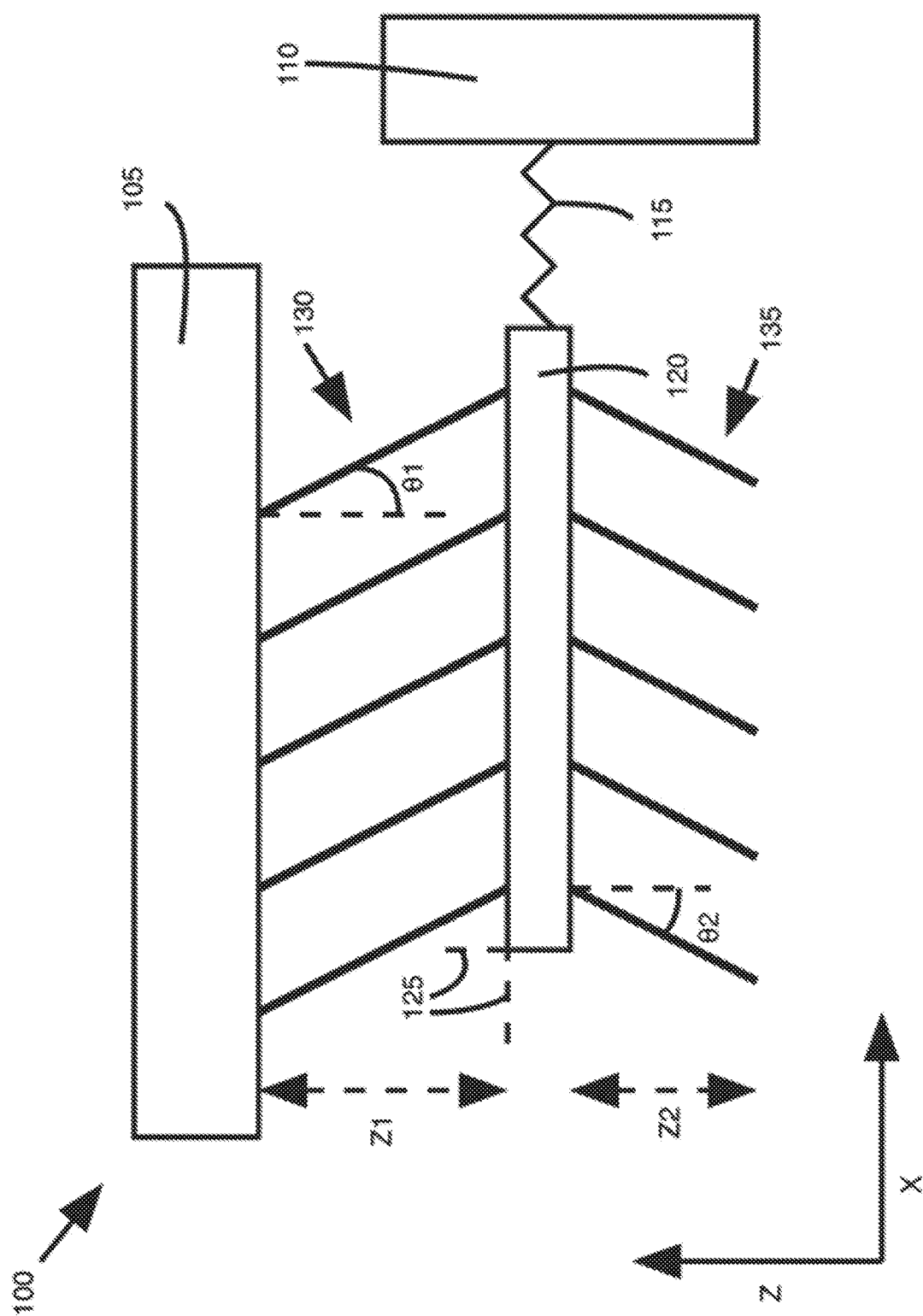
FIG. 1 depicts a simplified example test probe, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise.

Additionally, descriptions of Figures herein may be made with reference to specific elements illustrated and enumerated in the Figures. However, it will be understood that each and every element may not be enumerated for the sake of clarity, conciseness, and lack of redundancy. Rather, only one of some repeated elements may be enumerated and discussed, and other similarly situated elements may include aspects of the discussed elements.

Embodiments herein may leverage batch-based manufacturing, but conjoin it in a geometry that adds higher overtravel while canceling out undesirable scrub seen at the connection between the test probe and the DUT. As used herein, overtravel may refer to the vertical distance that the test probe needs to travel after first coupling with the DUT (assuming that the test probe and the DUT are vertically aligned). The overtravel may ensure a stronger connection between the test probe and the DUT. Scrub may refer to lateral translation of the end of the test probe based on vertical compression of the test probe to the DUT (again assuming that the test probe and the DUT are vertically aligned). Specifically, as the test probe is moved closer to the DUT, the beams of the test probe may deform laterally. Scrub may be especially prevalent if the beams are angled with respect to the vertical axis prior to coupling the test probe and the DUT. For example, in some legacy cases vertical movement of approximately 25 micrometers ("microns" or "m") may result in approximately 25 to 50 microns of scrub. More generally, vertical movement of x microns may result in between approximately 1x-2x microns of scrub. This level of scrub may be undesirable as it may cause beams of the test probe to short against one another, or it may cause the ends of the test probe to slip away from the portion of the DUT which the test probe is intended to measure.

In embodiments, the advantages above may be realized by adapting angled beam technology to a more efficient geometric configuration. Specifically, the test probe may include a mid-layer substrate with one or more degrees of freedom. The degrees of freedom may stem from a first plurality of angled beams secured to the top side of the mid-layer, and also anchored to a solid base. The lower side of the test probe may include an additional plurality of beams that are coupled with the substrate and are to contact the DUT. Both the top and the bottom plurality of beams may be configured to deform to achieve a desirable amount of compression for an electrically stable interconnect.

FIG. 1 depicts a simplified example test probe 100, in accordance with various embodiments. Specifically, the test probe 100 may include a probe base 105. The probe base 105 may be generally formed of a material such as plastic, stainless steel, silicon, glass, or some other generally dielectric material. The probe base 105 may be coupled with a first plurality of beams 130. The beams may be formed of a conductive material such as nickel, iron, cobalt, composites thereof, or some other conductive material. In some embodiments the first plurality of beams 130 may have a conductive coating such as silver, copper, etc.

As can be seen in FIG. 1, respective beams of the first plurality of beams 130 may be angled away from normal by an angle θ1. As used herein, "normal" may refer to a direction perpendicular to the face of the base or substrate to which the beams are coupled. In embodiments, the angle θ1 may be between approximately 20 and approximately 45 degrees. However, in other embodiments the angle θ1 may be greater or lesser. In some embodiments, each beam within the first plurality of beams 130 may be angled at the same angle, while in other embodiments different beams may have a different amount of angle. Additionally, respective beams of the first plurality of beams 130 may have a z-height Z1 of between approximately 300 microns and approximately 500 microns, however in other embodiments the beams may have a greater or lesser z-height. For example, in some embodiments the first plurality of beams 130 may have a z-height Z1 as high as approximately 1000 microns.

Generally, the probe base 105 may include one or more conductive elements such as traces, vias, or some other conductive element that may be coupled with respective beams of the first plurality of beams 130. The conductive elements may be configured to convey signals to or from one or more of the beams of the first plurality of beams 130.

The test probe 100 may also include an intermediate substrate 120. Embodiments, the intermediate substrate 120 may be formed of a dielectric material such as the dielectric materials discussed above with respect to probe base 105. For example, in some embodiments the intermediate substrate 120 may be formed of plastic, ceramics, silicon, glass, or some other material.

In some embodiments, movement of the intermediate substrate 120 may be constrained in the lateral direction, for example along the horizontal axis "X" as shown in FIG. 1. Specifically, the movement of the intermediate substrate 120 may be constrained by constraint 115. Constraint 115 may be, for example, a spring that is coupled with the intermediate substrate 120 at one end and coupled with a body 110 of the probe device of which the test probe 100 is a part. If the constraint 115 is a spring, then the spring may have a relatively low spring constant, which would have a positive value in the embodiment depicted in FIG. 1, however the spring configuration or spring constant may vary in other embodiments. In other embodiments the constraint 115 may be, for example, a magnet (e.g., repelling or attracting magnets coupled with the body 110 and the intermediate substrate 120), a physical stop, or some other type of constraint. In some embodiments, the constraint 115 may be on the left side of the intermediate substrate 120 (as oriented in FIG. 1) rather than the right side. In some embodiments, the test probe 100 may include a plurality of constraints which may be of the same type or different type as one another, and may be on the same side or different sides from one another with respect to the intermediate substrate 120. In some embodiments, there may not be a constraint 115.

The test probe 100 may further include a second plurality of beams 135. The second plurality of beams 135 may be formed of a conductive material similar to the conductive material discussed above with respect to the first plurality of beams 130. For example, the second plurality of beams 135 may be formed of a material such as nickel, iron, cobalt, composites thereof, or some other conductive material. In some embodiments the second plurality of beams 135 may have a conductive coating such as silver, copper, etc. The first plurality of beams 130 and the second plurality of beams 135 may be formed of the same material as one another, or they may be formed of different materials from one another. As can be seen in FIG. 1, the second plurality of beams 135 may be offset from normal with respect to the face of the intermediate substrate 120 by an angle θ2. In embodiments, θ2 may be between approximately 20 degrees and approximately 45 degrees away from normal. In some embodiments, the angles θ1 and θ2 may be the same as one another or different from one another. In some embodiments, the normal for measurement of the angles θ1 and θ2 may be the same as one another (e.g., both measured with respect to the probe base 105 or the intermediate substrate 120), or the normal for measurement of the angle θ1 may be with respect to probe base 105 while the normal for measurement of the angle θ2 may be with respect to intermediate substrate 120. In some embodiments, the second plurality of beams 135 may have a z-height Z2 of between approximately 200 microns and approximately 350 microns, however in other embodiments the z-height of the second plurality of beams may be larger or smaller. For example, in some embodiments the second plurality of beams 135 may have a z-height Z2 of up to approximately 700 microns.

Additionally, in embodiments the arrangement of the first plurality of beams 130, the intermediate substrate 120, and the second plurality of beams 135 may allow the second plurality of beams to have a pitch of less than 40 microns and, in some embodiments, less than or equal to 36 microns. More specifically, the distance from a central point at the end of one beam of the second plurality of beams 135 may be less than or equal to 36 microns from a central point at the end of another beam of the second plurality of beams along the X axis. It is worth noting that in some embodiments the first plurality of beams 130 may have a pitch that is different than the pitch of the second plurality of beams 135. For example, in some embodiments the first plurality of beams 130 may have a pitch that is larger than the pitch of the second plurality of beams 135. Additionally, in some embodiments the pitch of the second plurality of beams 135 at a portion of the second plurality of beams 135 coupled with the intermediate substrate 120 may be different than the pitch of the second plurality of beams 135 at a portion of the second plurality of beams 135 that is to couple with the DUT, as described in further detail below.

Generally, the second plurality of beams 135 may be configured to couple with a DUT. More specifically, the ends of the second plurality of beams 135 that are furthest from the intermediate substrate 120 may be configured to couple with the DUT. As mentioned above, the second plurality of beams 135 may be configured to receive or generate one or more electrical signals that may propagate throughout the second plurality of beams 135. The intermediate substrate 120 may have one or more traces or vias (not shown) that communicatively coupled the second plurality of beams 135 with the first plurality of beams 130. The electrical signals may therefore propagate from the second plurality of beams 135, through the intermediate substrate 120, and to the first plurality of beams 130. The electrical signals may then propagate from the first plurality of beams 130 through the probe base 105 and ultimately to a system that is coupled with the test probe 100.

In embodiments, when the test probe 100 couples with the DUT, and pressure is applied by the DUT against the second plurality of beams 135, the first plurality of beams 130 and the second plurality of beams 135 may deform. More specifically, they may compress in the direction indicated by the Z axis. In this embodiment, the intermediate substrate 120 may move both laterally (e.g., along the X axis) and vertically (e.g., along the Z axis). Marker lines 125 depict a starting position of the top left (as oriented with respect to FIG. 1) corner of the intermediate substrate 120.

Figure 2:
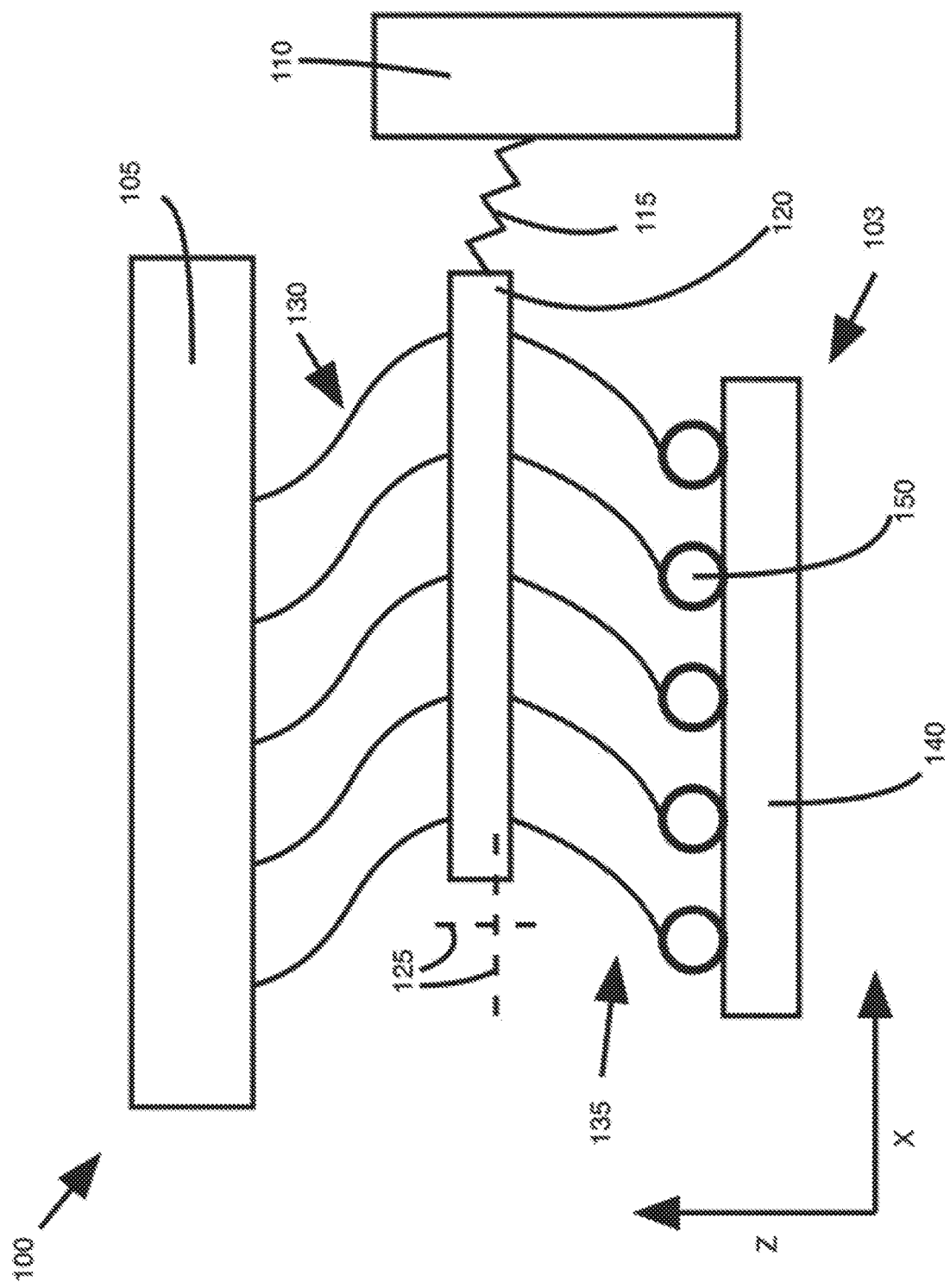
FIG. 2 depicts an alternative view of the simplified example test probe when the test probe is in contact with a DUT, in accordance with various embodiments.

FIG. 2 depicts an example of the test probe 100 being coupled with a DUT 103. The DUT 103 may include a DUT substrate 140 and a plurality of contacts 150. The DUT substrate 140 may be, for example, a cored or coreless substrate composed of a dielectric material such as Ajimoto Build-Up Film (ABF) or some other material. The DUT substrate 140 may have a plurality of traces, vias, or some other conductive pathway therein. The DUT substrate 140 may have a plurality of elements such as circuitry, transistors, logic, processors, memory, etc. either coupled with the substrate or positioned at least partially within the substrate. The contacts 150 may be, for examples, pads, solder bumps, balls of a ball grid array (BGA), pins of a pin grid array (PGA) or some other type of contact.

As can be seen, the ends of the second plurality of beams 135 may be configured to communicatively and physically couple with the contacts 150 of the DUT 103. When the test probe 100 is coupled with the DUT 103, the test probe 100 may be configured to send one or more electrical signals, through the second plurality of beams 135, to the DUT 103. If the DUT 103 is configured to process the signals and provide a return signal, then the test probe 100, may be configured to receive those return signals and transmit them to a system coupled with the test probe for further measurement or analysis. Additionally or alternatively, the test probe 100 may be configured to passively receive one or more signals from the DUT 103 without first providing a signal to the DUT 103.

When the test probe 100 couples with the DUT 103, the first plurality of beams 130 and the second plurality of beams 135 may deform as shown in FIG. 2. Additionally, the intermediate substrate 120 may travel both laterally (e.g., along the X axis), and vertically (e.g., along the Z axis), as described above. This travel may be seen with reference to marker lines 125. More specifically, whereas in FIG. 1 the top left corner (with reference to the orientation of FIGS. 1 and 2) of the substrate was depicted aligned with the marker lines 125, it can be seen in FIG. 2 that the top left corner of the substrate may be up and to the right of the marker lines 125. More generally, the test probe may be compressed by approximately 25 to approximately 60 microns, though in other embodiments the amount of compression may be greater or smaller dependent on test parameters. The intermediate substrate 120 may travel approximately 20 microns to approximately 80 microns along the X axis and approximately ten microns to approximately 40 microns along the Z axis. More generally, the intermediate substrate 120 may travel approximately half of the distance along the Z axis that it travels along the X axis.

By allowing this travel along the Z and X axes, the ends of the second plurality of beams 135 that are coupled with the contacts 150 of the DUT 103 may experience little to no scrub, as described above. In some embodiments, some amount of scrub may still be allowed, and the amount may be a targeted or designed value based on, for example, contact dynamic characteristics.

More specifically, because the first and second plurality of beams 130 and 135 may deform as shown in FIG. 2, and the intermediate substrate 120 may travel along the X and Z axes, the ends of the second plurality of beams 135 may travel along the Z axis when under compression with little to no travel along the X axis. As such, difficulties experienced by legacy test probes such as scrub, shorting, or other difficulties may be almost entirely, or completely, negated. If scrub still exists, it may be on the order of 0-20% movement rather than the approximately 100-200% that may be experienced by legacy test probes. More specifically, the travel along the X axis of the ends of the second plurality of beams 135 that are coupled with the DUT may be between approximately zero and approximately 20% of the travel along the Z axis of the same ends. This scrub may allow the test probe to operate using a pitch (e.g., 36 microns as discussed above) that is significantly less than the pitch achievable by legacy test probes. Additionally, the amount of stress seen by each beam in the test probe may be reduced by approximately 38%, which may result in a more robust and longer-lasting beam design. More generally, the amount of stress seen by each beam in the test probe may be reduced by approximately 30% and 50% over legacy designs, although it will be understood that the specific reduction in stress may vary based on design factors, materials used, the cross sections of various materials such as the beams or the intermediate substrate, etc.

Finally, because the test probes 100 may be batch-produced on a wafer-level scale, the cost of each test probe may be significantly lower than the cost of a legacy test probe. By eliminating or reducing these difficulties, the test probe 100 may stay more completely coupled with the DUT 103, and resultant test signals or measurements may therefore be taken with a lower rate of measurement errors.

Figure 3:
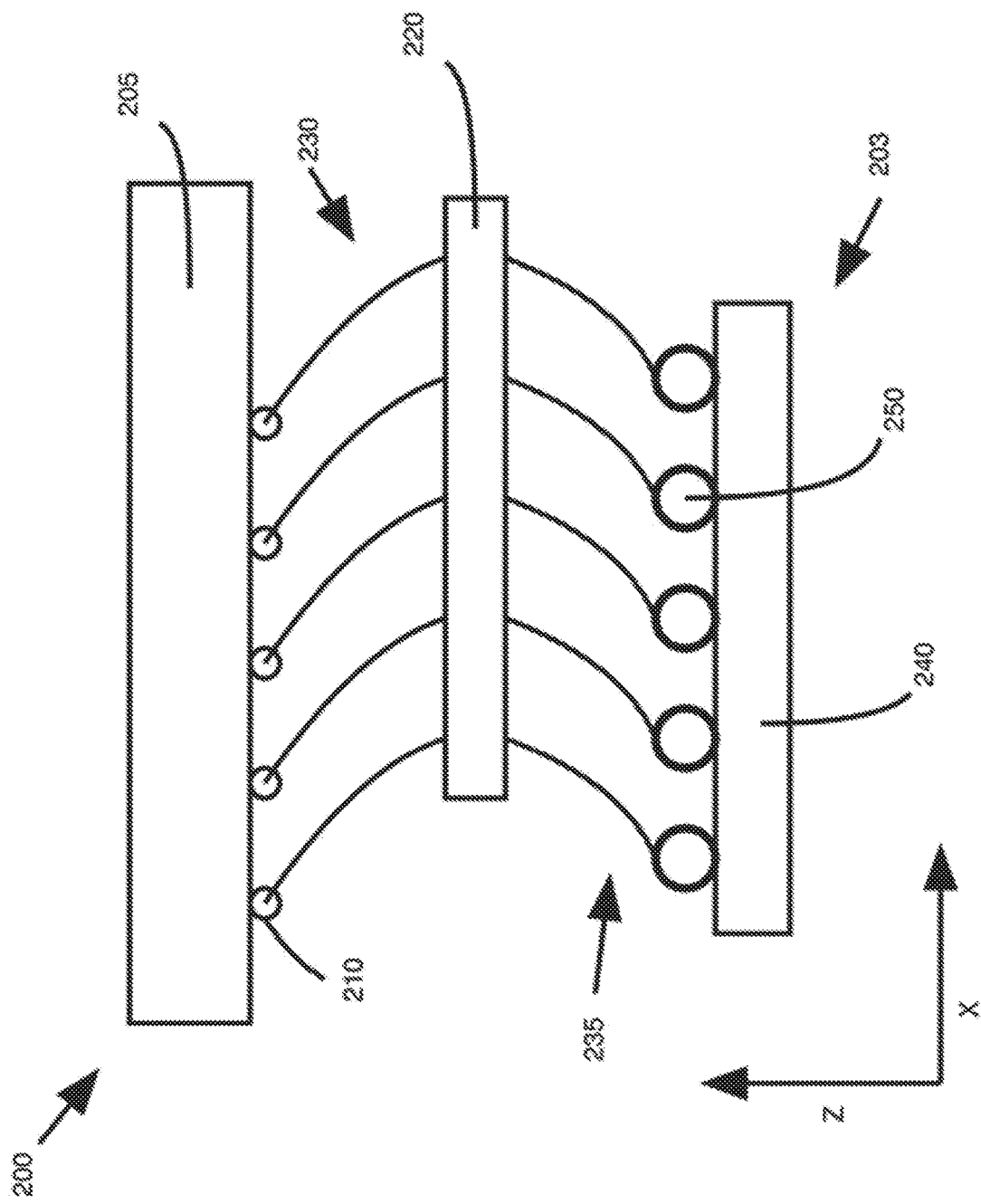
FIG. 3 depicts an alternative simplified example test probe, in accordance with various embodiments.

FIG. 3 depicts an alternative simplified example test probe 200. The test probe 200 may include a probe base 205, a first plurality of beams 230, an intermediate substrate 220, and a second plurality of beams 235 which may be respectively similar to probe base 105, first plurality of beams 130, intermediate substrate 120, and second plurality of beams 135. The test probe 200 may be coupled with a DUT 203, which may be similar to DUT 103, and which may include DUT substrate 240 and contacts 250, which may be similar to DUT substrate 140 and contacts 150. In some embodiments, there may be additional elements such as a constraint similar to constraint 115, however some of those elements may not be depicted in FIG. 3 for the sake of lack of redundancy.

In some embodiments, for example in test probe 100, the first plurality of beams 130 may be solidly anchored to the probe base 105. For example, the first plurality of beams 130 may be soldered or otherwise coupled to the probe base 105 such that the end of the first plurality of beams 130 that is coupled to the probe base 105 is unable to move with respect to the probe base. However, in other embodiments such as the test probe 200, the end of the first plurality of beams 230 may be coupled with the probe base 205 by a pivotable joint 210. The pivotable joint 210 may be, for example, a ball-and-socket joint or some other type of pivotable joint that may act similarly to a ball-and-socket joint, or even a different type of joint. For example, in some embodiments the pivotable joint 210 may simply be a vertical constraint on the end of the first plurality of beams 230 that is coupled with the probe base 205 via one or more other mechanical mechanisms. The pivotable joint 210 may allow the end of the first plurality of beams 230 that is coupled with the pivotable joint 210 to rotate with respect to the probe base 205 when the test probe 200 is coupled with the DUT 203. This rotation may, for example, further reduce stress on the test probe 200 and thereby further extend the useful life of the test probe 200.

It will be understood that the depictions of embodiments in FIGS. 1, 2, and 3 are intended as simplified examples, and specific numbers or element proportions should not be assumed based on the Figures unless otherwise explicitly stated. For example, in some embodiments although only five beams may be shown for the first plurality of beams 130/230 or the second plurality of beams 135/235, other embodiments may have more or fewer beams. For example, in some embodiments the first or second plurality of beams 130/230/135/235 may number in the tens, hundreds, thousands, or more. Additionally, in some embodiments the DUT may have more or fewer contacts than depicted in FIG. 1 or 2. There may be additional constraints such as constraint 115 that may be coupled with the intermediate substrate 120. In some embodiments, the probe base 105/205 or the intermediate substrate 120/220 may be disaggregated into a plurality of pieces rather than a single piece. Other variations may be present in other embodiments.

Additionally, it will be noted that the second plurality of beams 135/235 are described as being configured to couple with a DUT. In some embodiments, the coupling may be a removable coupling. That is, the second plurality of beams 135/235 may be configured to temporarily contact the DUT, but not be adhered to the DUT. In this way, the same test probe may be able to able to test several DUTs over the life span of the test probe. In some embodiments, the test probe, and more specifically the second plurality of beams 135/235 may be configured to adhere to the DUT in some way, for example via an adhesive, a solder joint, etc. In some embodiments, the adherence may be light (e.g., a mild adhesive) so that the test probe may still be able to test a plurality of DUTs, while in other embodiments the adherence may be relatively permanent (e.g., a solder joint), so that the test probe may only be able to test one or only a few DUTs over the useful life span of the probe.

Figure 4:
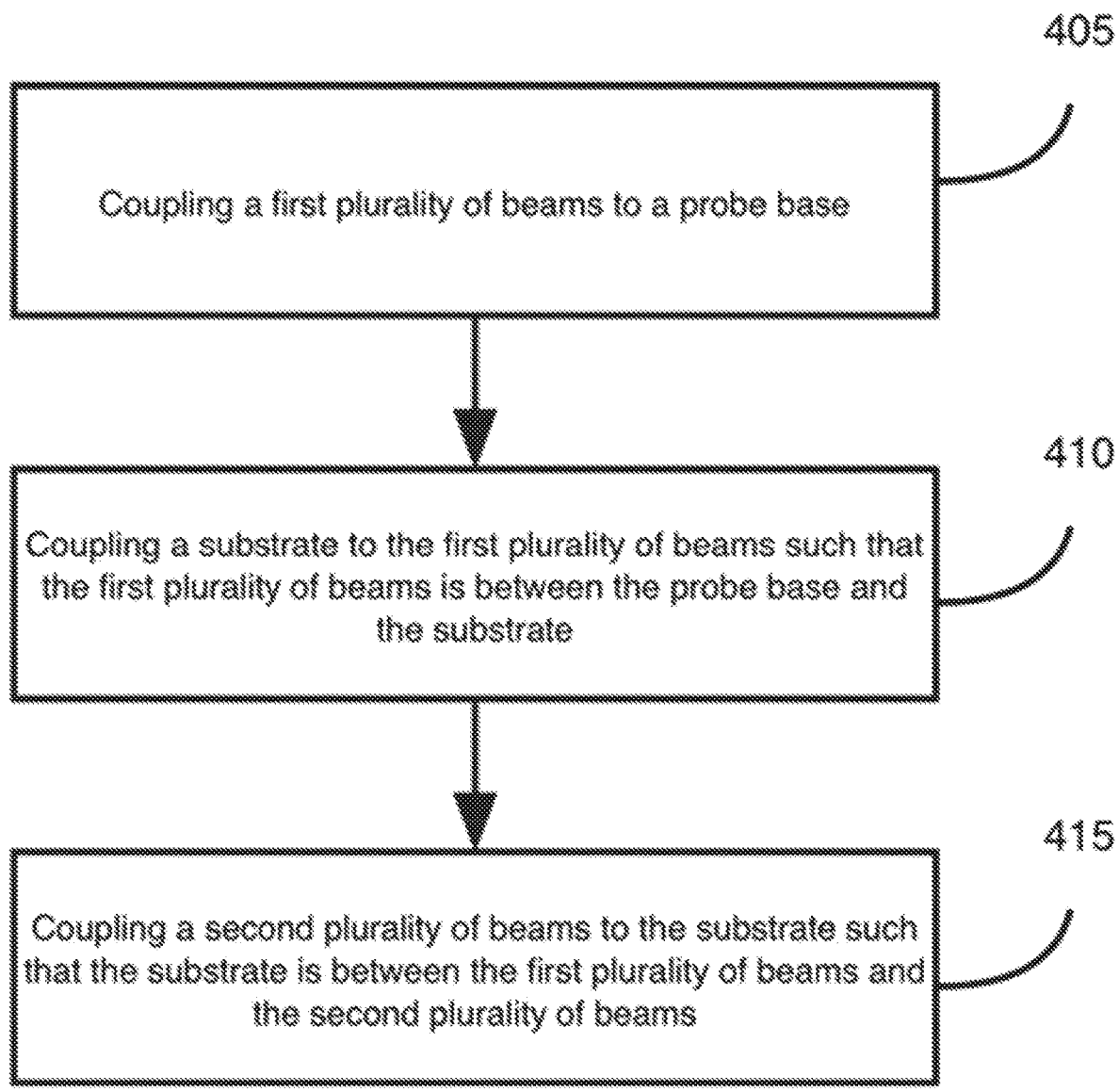
FIG. 4 depicts an example technique for constructing a test probe, in accordance with various embodiments.

FIG. 4 depicts an example technique for constructing a test probe, in accordance with various embodiments. The technique may include coupling, at 405, a first plurality of beams to a probe base. The first plurality of beams may be, for example, the first plurality of beams 130, and the probe base may be, for example, probe base 105. The first plurality of beams may be coupled with the probe base through an anchoring technique such as soldering or some other technique. Alternatively, the first plurality of beams may be similar to the first plurality of beams 230 and may be coupled with a probe base such as probe base 205 by a pivotable joint such as pivotable joint 210.

The technique may further include coupling, at 410, a substrate to the first plurality of beams such that the first plurality of beams is between the probe base and the substrate. The substrate may be, for example, intermediate substrates 120 or 220. The technique may further include coupling, at 415, a second plurality of beams to the substrate such that the substrate is between the first plurality of beams and the second plurality of beams. The second plurality of beams may be, for example, second plurality of beams 135 or 235.

It will be understood, however, that this technique is one example technique. In other embodiments different elements may be performed in a different order. For example, in some embodiments element 415 may occur prior to element 405. That is, the beams may be coupled to the substrate before the first plurality of beams are coupled with the probe base. Alternatively, element 415 may occur prior to element 410. Other variations may be envisioned.

EXAMPLES OF VARIOUS EMBODIMENTS

Example 1 includes a test probe comprising a base that includes a face and a first plurality of beams, where individual ones of the first plurality of beams include a first end and a second end opposite the first end, the first end of the individual ones of the first plurality of the beams is coupled with the face of the base, and the individual ones of the first plurality of beams are angled in a first direction as measured perpendicular to the face of the base. The test probe further comprises a second plurality of beams, where individual ones of the second plurality of beams include a first end and a second end, the first end of the individual ones of the second plurality of beams is coupled with the second end of the individual ones of the first plurality of beams, and the individual ones of the second plurality of beams are angled in a second direction as measured perpendicular to the face of the base.

Example 2 includes the test probe of example 1, further comprising a substrate positioned between the first plurality of beams and the second plurality of beams, wherein the substrate is coupled with the second end of the first plurality of beams and the substrate is further coupled with the first end of the second plurality of beams.

Example 3 includes the test probe of example 1, wherein the second end of the second plurality of beams are to temporarily couple with a DUT.

Example 4 includes the test probe of any of examples 1-3, wherein the first plurality of beams have a z-height, as measured perpendicular to the face of the base, of between 300 and 1000 micrometers.

Example 5 includes the test probe of any of examples 1-3, wherein the second plurality of beams have a z-height, as measured perpendicular to the face of the base, of between 200 and 700 micrometers.

Example 6 includes the test probe of any of examples 1-3, wherein the first direction is opposite the second direction.

Example 7 includes the test probe of any of examples 1-3, wherein the first plurality of beams are angled by between 20 and 45 degrees.

Example 8 includes the test probe of any of examples 1-3, wherein the second plurality of beams are angled by between 20 and 45 degrees.

Example 9 includes the test probe of any of examples 1-3, wherein the second plurality of beams have a pitch of less than 36 micrometers.

Example 10 includes a test probe comprising: a probe base that includes a face; a first set of beams coupled with the face of the probe base, wherein the first set of beams are angled away from a normal in a first direction, the normal measured/defined in a direction perpendicular to the face; a substrate with a first side and a second side opposite the first side, wherein the first side of the substrate is coupled with the first set of beams such that the first set of beams are positioned between the probe base and the substrate; and a second set of beams coupled with the second side of the substrate.

Example 11 includes the test probe of example 10, wherein the second set of beams is angled in a second direction, and where the first direction is opposite the second direction.

Example 12 includes the test probe of examples 10 or 11, wherein the second set of beams are to couple with a DUT.

Example 13 includes the test probe of example 12, wherein lateral scrub of a side of the second set of beams that is coupled with the DUT is between 0 and 20% of vertical movement of the second set of beams when the test probe is coupled with the DUT.

Example 14 includes the test probe of examples 10 or 11, wherein the first set of beams is coupled with the probe base by a pivotable joint.

Example 15 includes the test probe of example 14, wherein the pivotable joint behaves similar to a ball-and-socket joint.

Example 16 includes the test probe of examples 10 or 11, wherein movement of the substrate is constrained in a direction parallel to the face of the probe base.

Example 17 includes the test probe of example 16, wherein the movement of the substrate is constrained by a stop, a spring, or a magnet.

Example 18 includes a method of manufacturing a test probe, the method comprising: coupling a first plurality of beams to a probe base; coupling a substrate to the first plurality of beams such that the first plurality of beams is between the probe base and the substrate; and coupling a second plurality of beams to the substrate such that the substrate is between the first plurality of beams and the second plurality of beams.

Example 19 includes the method of example 18, wherein coupling the first plurality of beams to the probe base includes coupling the first plurality of beams at an angle between 20 and 45 degrees away from a normal, the normal measured/defined with respect to a face of the probe base to which the first plurality of beams are coupled.

Example 20 includes the method of example 18, wherein coupling the second plurality of beams to the substrate includes coupling the second plurality of beams at an angle between 20 and 45 degrees away from a normal, the normal measured/defined with respect to a face of the substrate to which the second plurality of beams are coupled.

Example 21 includes the method of any of examples 18-20, further comprising constraining movement of the substrate in a direction parallel to a face of the substrate to which the first plurality of beams or the second plurality of beams are coupled.

Example 22 includes the method of example 21, wherein constraining the movement includes coupling the substrate with a stop, a magnet, or a spring.

Example 23 includes the method of any of examples 18-20, wherein coupling the first plurality of beams to the probe base includes coupling the first plurality of beams to the probe base using a pivotable couple.

Example 24 includes the method of example 23, wherein the pivotable couple is a ball-and-socket joint.

Example 25 includes a probe device that comprises: a body; a mount to physically (e.g., mechanically) and communicatively couple the body to a test system; and a plurality of test probes coupled to the body, wherein a test probe of the plurality of test probes comprises: a probe base; a first plurality of beams coupled with the probe base; a substrate coupled with the first plurality of beams such that the first plurality of beams are positioned between the probe base and the substrate; and a second plurality of beams coupled with the substrate such that the substrate is positioned between the first plurality of beams and the second plurality of beams.

Example 26 includes the probe device of example 25, wherein the first plurality of beams are coupled with the probe base at an angle between 20 and 45 degrees away from a normal as defined with respect to a face of the probe base to which the first plurality of beams are coupled.

Example 27 includes the probe device of example 25, wherein the second plurality of beams are coupled with the substrate at an angle between 20 and 45 degrees away from a normal as defined with respect to a face of the substrate to which the second plurality of beams are coupled.

Example 28 includes the probe device of any of examples 25-27, wherein movement of the substrate is constrained in a direction parallel to a face of the substrate to which the first plurality of beams or the second plurality of beams are coupled.

Example 29 includes the probe device of example 28, wherein the movement of the substrate is constrained by a constraint coupled with the body of the probe device.

Example 30 includes the probe device of example 29, wherein the constraint is a stop, a spring, or a magnet.

Example 31 includes the probe device of any of examples 25-27, wherein the second plurality of beams are to couple with a DUT.

Example 32 includes the probe device of any of examples 25-27, wherein the first plurality of beams have a z-height, as measured perpendicular to a face of the probe base to which the first plurality of beams are coupled, of between 300 and 500 micrometers.

Example 33 includes the probe device of any of examples 25-27, wherein the second plurality of beams have a z-height, as measured perpendicular to a face of the substrate to which the second plurality of beams are coupled, of between 200 and 350 micrometers.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the various embodiments, including what is described in the Abstract, is not intended to be exhaustive or to limit the disclosure to the precise forms disclosed. While specific implementations of, and examples for, various embodiments are described herein for illustrative purposes, various equivalent modifications are possible within the scope of the disclosure, as those skilled in the relevant art will recognize. These modifications may be made in light of the above detailed description. The terms used in the following claims should not be construed to limit this disclosure to the specific embodiments disclosed in the specification and the claims.

The invention claimed is:

1. A test probe comprising:
   a base;
   a substrate;
   a plurality of first beams, wherein a first end of individual ones of the first beams is coupled to the base and a second end of individual ones of the first beams is coupled to the substrate, and wherein individual ones of the first beams are angled in a first direction non-perpendicular to a face of the base and non-perpendicular to a face of the substrate; and a plurality of second beams, wherein the substrate couples a first end of individual ones of the second beams with individual ones of the first beams and wherein individual ones of the second beams are angled in a second direction non-perpendicular to the face of the base and non-perpendicular to the face of the substrate, the second direction such that a first lateral offset between the first and second ends of individual ones the first beams is opposed by a second lateral offset between the first end and a second, free, end of individual ones of the second beams.

2. The test probe of claim 1, wherein the substrate comprises one or more conductive traces or vias coupled with the second end of individual ones of the first beams, the traces or vias further coupled with the first end of individual ones of the second beams.

3. The test probe of claim 1, wherein the second end of individual ones of the second beams is free to couple with an electronic device under test (DUT).

4. The test probe of claim 1, wherein individual ones of the first beams extend from the base to a z-height of between 300 and 1000 micrometers.

5. The test probe of claim 1, wherein individual ones of the second beams extend from the base to a z-height of between 200 and 700 micrometers.

6. The test probe of claim 1, wherein the first direction is opposite the second direction.

7. The test probe of claim 1, wherein individual ones of the first and second beams are angled by between 20 and 45 degrees from perpendicular to the face of the base.

8. The test probe of claim 1, wherein the second plurality of beams have a pitch of less than 40 micrometers.

9. The test probe of claim 1, wherein the second plurality of beams have a pitch of less than 40 micrometers.

10. A test probe comprising:
a base;
a plurality of first beams, wherein a first end of individual ones of the first beams is coupled to the base at a first angle between 20 and 45 degrees from perpendicular to a face of the base;
a plurality of second beams; and
a substrate, wherein a first side of the substrate is coupled to a second end of individual ones of the first beams, and wherein a second side of the substrate, opposite the first side, is coupled to a first end of individual ones of the second beams, wherein the second beams are coupled with the substrate at a second angle between 20 and 45 degrees from perpendicular to the second side of the substrate, the second angle such that a first direction of the first beams is opposed by a second direction of the second beams.

11. The test probe of claim 10, wherein individual ones of the first the first and second directions are both within a same x-z plane direction.

12. The test probe of claim 10, wherein a second end of individual ones of the second beams is free to couple with a device under test (DUT).

13. The test probe of claim 10, wherein the first beams are coupled with the base by a pivotable joint.

14. The test probe of claim 10, wherein movement of the substrate is constrained in a direction parallel to the face of the base.

15. A method of manufacturing a test probe, the method comprising:
coupling a first end of individual ones of a plurality of first beams to a probe base at a first angle between 20 and 45 degrees from perpendicular to a face of the probe base;
coupling a first side of a substrate to a second end of individual ones of the first beams; and
coupling a first end of individual ones of a plurality of second beams to a second side of the substrate, opposite the first side, at a second angle between 20 and 45 degrees from perpendicular to the second side of the substrate, the second angle reducing such that a lateral offset associated with individual ones of the first beams with is opposed by a lateral offset associated with individual ones of the second beams.

16. The method of claim 15, wherein coupling the first beams to the probe base comprises coupling the first beams at an angle between 20 and 45 degrees from perpendicular to the first side of the substrate.

17. The method of claim 15, wherein coupling the first plurality of beams to the probe base includes coupling the first plurality of beams to the probe base using a pivotable couple.

18. A electrical probe device comprising:
a body;
a mount to physically and communicatively couple the body to an electrical test system;
a substrate coupled to the body;
a plurality of first beams, wherein a first end of individual ones of the first beams is coupled to a first side of the substrate angled in a first direction non-perpendicular to the first side of the substrate;
a plurality of second beams, wherein a first end of individual ones of the second beams is coupled to a second side of the substrate, opposite the first side, and angled in a second direction non-perpendicular to the second side of the substrate; and
a base, wherein a face of the base is coupled to a second end of individual ones of the first beams, and wherein a second end of individual ones of the second beams is free to contact a device under test (DUT) at a position laterally offset from the second end of individual ones of the first beams by an amount that opposes a lateral offset between first and second ends of the first beams.

19. The probe device of claim 18, wherein the first beams are coupled with the first side of the substrate at a first angle between 20 and 45 degrees from perpendicular to the first side of the substrate.

20. The probe device of claim 19, wherein the second beams are coupled with the second side of the substrate at a second angle between 20 and 45 degrees from perpendicular to the second side of the substrate.

21. The probe device of claim 18, wherein the first and second angles are in opposing opposite directions.

22. The probe device of claim 18, wherein movement of the substrate is constrained in a direction parallel to the first and second sides of the substrate.

23. The probe device of claim 18, wherein individual ones of the first beams extend from the first side of the substrate to a z-height of between 300 and 1000 micrometers.

24. The probe device of claim 18, wherein individual ones of the second beams extend from the second side of the substrate to a z-height of between 200 and 700 micrometers.

* * * * *